United States Patent
Barringer et al.

(10) Patent No.: US 6,930,892 B2
(45) Date of Patent: Aug. 16, 2005

(54) DOCKING CASSETTE FOR PRINTED CIRCUIT BOARDS

(75) Inventors: Dennis R. Barringer, Wallkill, NY (US); Shawn Canfield, Poughkeepsie, NY (US); Jody A. Hickey, Hyde Park, NY (US); Peter W. Kelly, Stone Ridge, NY (US); Edward J. Seminaro, Milton, NY (US); Harold M. Toffler, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 10/688,525

(22) Filed: Oct. 17, 2003

(65) Prior Publication Data

US 2005/0083669 A1 Apr. 21, 2005

(51) Int. Cl.⁷ .............................. H05K 7/16; H05K 7/14
(52) U.S. Cl. ........................ 361/801; 361/726; 361/732; 361/740; 361/747; 361/759; 361/755
(58) Field of Search ................................. 361/728–732, 361/740, 741, 747, 752, 754–756, 759, 801; 174/50, 52.1

(56) References Cited

U.S. PATENT DOCUMENTS

| | | | |
|---|---|---|---|
| 5,528,951 A | 6/1996 | Tkahashi et al. | 74/441 |
| 6,597,581 B2 * | 7/2003 | Barringer et al. | 361/756 |
| 6,606,255 B2 * | 8/2003 | Barringer et al. | 361/807 |
| 6,671,184 B1 * | 12/2003 | Barringer et al. | 361/801 |
| 6,674,651 B2 * | 1/2004 | Momiyama et al. | 361/796 |
| 6,678,170 B2 * | 1/2004 | Barringer et al. | 361/800 |
| 6,709,276 B2 * | 3/2004 | Barringer et al. | 439/64 |
| 6,785,133 B2 * | 8/2004 | Barringer et al. | 361/694 |
| 6,794,571 B1 * | 9/2004 | Barringer et al. | 174/35 GC |
| 6,801,434 B2 * | 10/2004 | Gallarelli et al. | 361/747 |
| 6,816,382 B2 * | 11/2004 | Barringer et al. | 361/752 |
| 6,816,383 B2 * | 11/2004 | Barringer et al. | 361/759 |

* cited by examiner

Primary Examiner—Kamand Cuneo
Assistant Examiner—Dameon E. Levi
(74) Attorney, Agent, or Firm—Lily Neff; Cantor Colburn LLP

(57) ABSTRACT

A docking apparatus for printed circuit boards including a cassette housing so as to define a housing cavity for containing a printed circuit board (PCB) and a linkage mechanism disposed so as to be associated with the cassette housing. The linkage mechanism includes a linkage arm pivotally connected to the cassette housing via a pivot and has a first arm pivotally connected to the PCB, a clevis pivotally connected to a second arm extending from the first arm, a shaft extending through an aperture in the clevis at a first end defining the shaft, the first end configured to operably transfer axial translation of the shaft to the clevis, and an opposite second end defining the shaft includes a thread, and a nut operably secured to the cassette housing. The nut is configured to threadably receive the thread for axial translation of the shaft therethrough, wherein rotation of the shaft translates the shaft causing pivotal movement of the linkage arm about the pivot via the clevis causing translation of the PCB in and out of engagement with a corresponding connector.

20 Claims, 8 Drawing Sheets

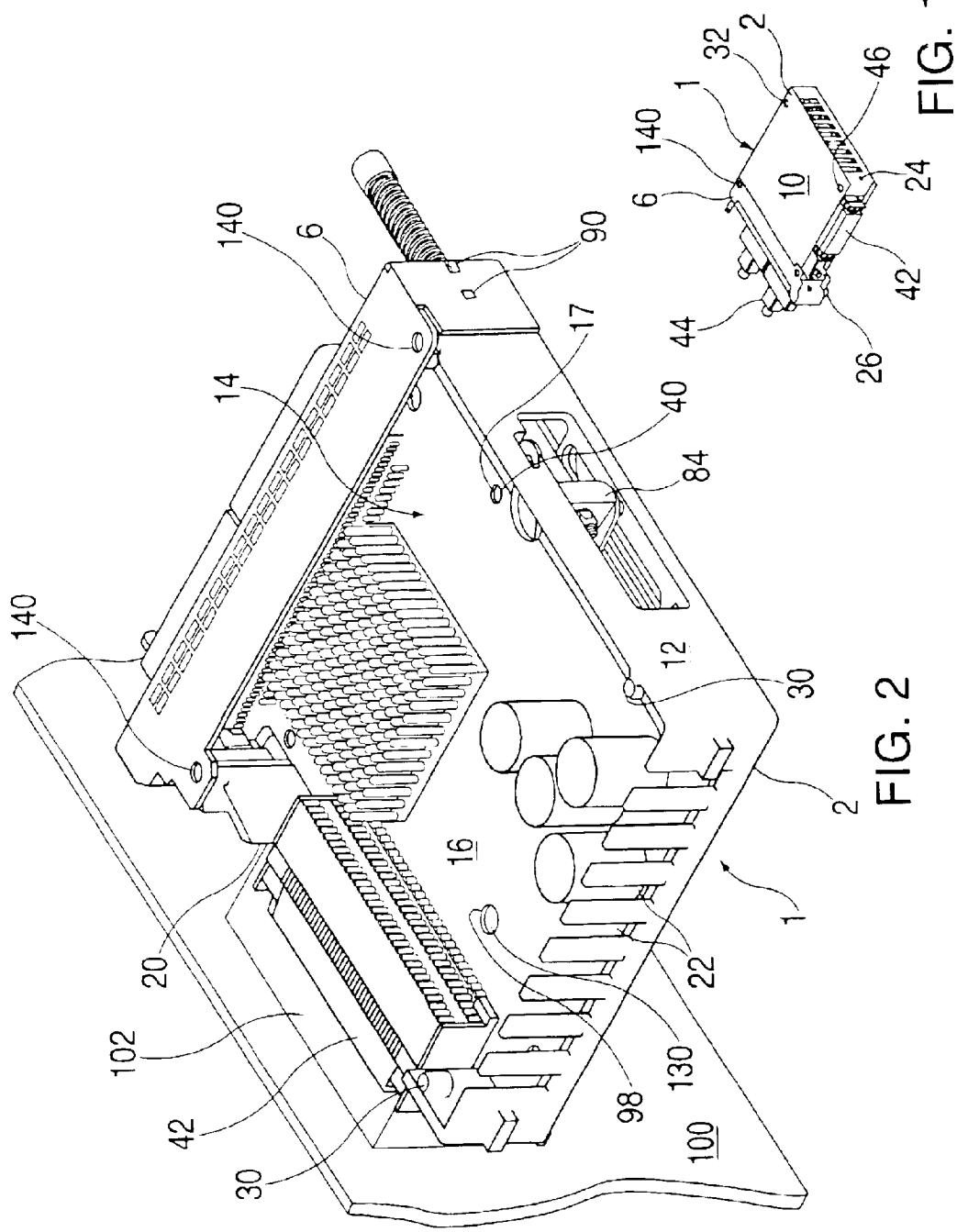

DOCKING CASSETTE FOR PRINTED CIRCUIT BOARDS

FIELD OF THE INVENTION

The present invention relates generally to a docking cassette for printed circuit boards and more specifically to a docking cassette for printed circuit boards that provides increased mechanical advantage to drive the printed circuit board in mating engagement with a corresponding connector.

BACKGROUND OF THE INVENTION

As integrated circuit (IC) and printed circuit board (PCB) design and fabrication techniques become more sophisticated, computer system design techniques must also become more sophisticated. This is because as IC's and PCB's become more densely populated, their performance capabilities and speeds increase and computer systems which employ these IC's and PCB's must be able to support the increase in performance. In addition, as businesses that employ these computer systems and components become more sophisticated, they demand greater performance from their computer systems resulting in increasingly densely populated PCB's and computer systems having tightly packed packages. As a result of these tightly packed packages, these PCB's and computer systems are susceptible to a variety of problems which must be considered.

For example, as components and circuits become smaller, their packaging becomes smaller thus allowing manufacturers and designers to more densely populate boards and systems. However, with the smaller packaging and more densely populated boards comes more signal interconnections with less card edge real estate available. Further, the increased signal interconnections increase the required force to make such interconnections. It has become very difficult to create enough mechanical advantage with present docking systems to overcome the high plug forces do to the increased signal interconnections. The forces in some cases are in excess of one hundred pounds which is more than the mechanical advantage available in the present systems employed.

Accordingly, there is a need to develop enough mechanical advantage to provide the forces and travel necessary to reliably seat and unseat the mating connectors associated with connecting and disconnecting, respectively, the PCB while maintaining a compact docking cassette.

SUMMARY OF THE INVENTION

A docking apparatus for printed circuit boards including a cassette housing so as to define a housing cavity for containing a printed circuit board (PCB) and a linkage mechanism disposed so as to be associated with the cassette housing. The linkage mechanism includes a linkage arm pivotally connected to the cassette housing via a pivot and has a first arm pivotally connected to the PCB, a clevis pivotally connected to a second arm extending from the first arm, a shaft extending through an aperture in the clevis at a first end defining the shaft, the first end configured to operably transfer axial translation of the shaft to the clevis, and an opposite second end defining the shaft includes a thread, and nut operably secured to the cassette housing. The nut is configured to threadably receive the thread for axial translation of the shaft therethrough, wherein rotation of the shaft translates the shaft causing pivotal movement of the linkage arm about the pivot via the clevis causing translation of the PCB in and out of engagement with a corresponding connector.

BRIEF DESCRIPTION OF THE DRAWINGS

Referring now to the figures, which are exemplary embodiments, and wherein the like elements are numbered alike:

FIG. 1 is a perspective view of a docking cassette in accordance with an embodiment of the invention;

FIG. 2 is a perspective view of the docking cassette of FIG. 1 with a cover removed and beginning mating interconnection with a corresponding card connector in accordance with an exemplary embodiment of the invention;

DETAILED DESCRIPTION OF THE INVENTION

Referring generally to the figures, a docking apparatus 1 for mounting a printed circuit board (PCB) into a computer system is shown, in accordance with an embodiment of the invention. Docking apparatus 1 preferably provides structural support to the PCB so as to allow for the easy insertion and removal of the PCB from a computer system, as well as thermal and electrical isolation from other PCB's and components within the computer system.

Figure 3:
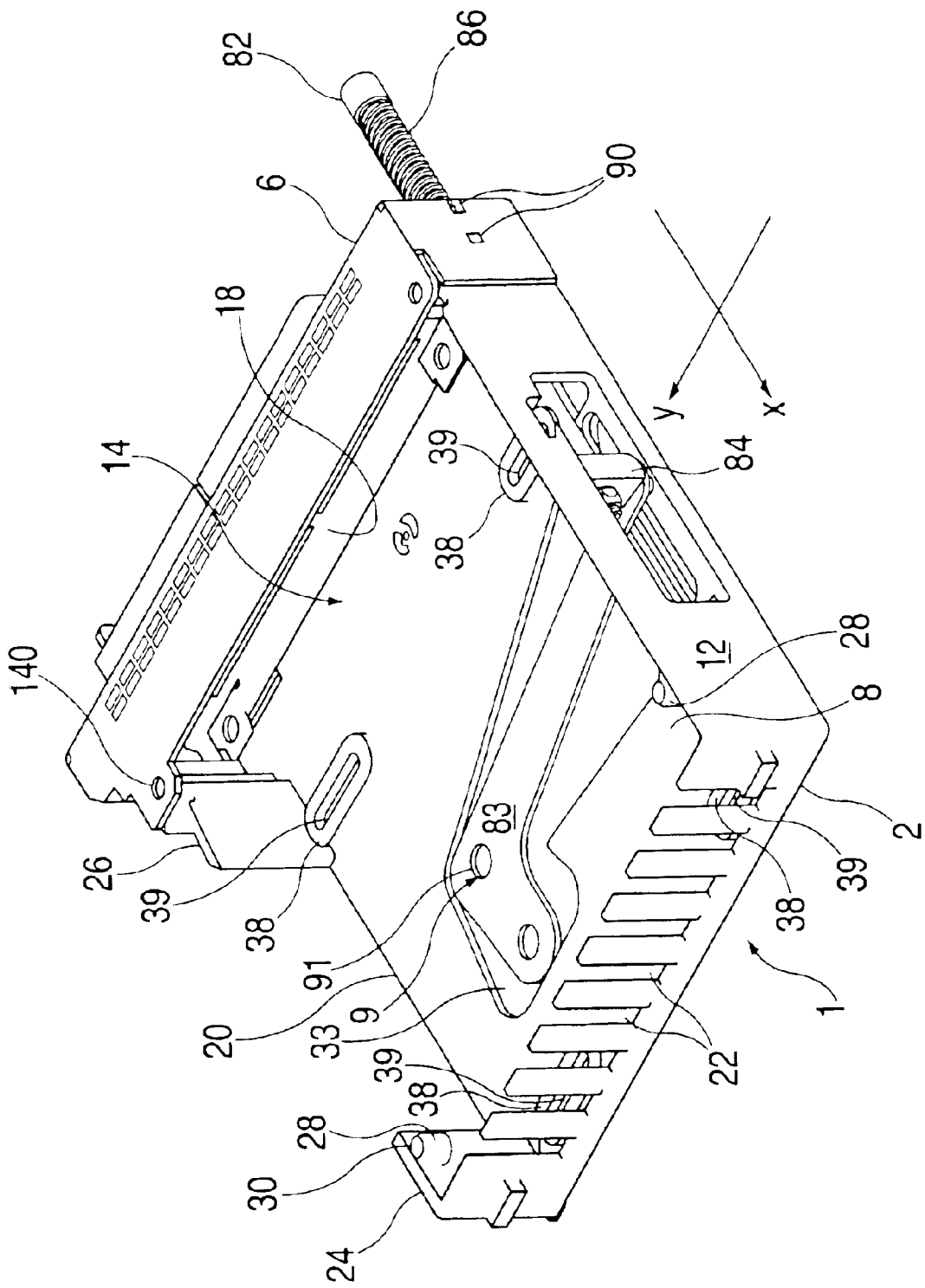
FIG. 3 is a perspective view of FIG. 2 illustrating the docking cassette shown removed from the card connector and card removed therefrom.

Referring to FIG. 1, FIG. 2, and FIG. 3, a docking apparatus 1 for mounting a printed circuit board (PCB) in a computer system is shown, in accordance with an embodiment of the invention. Docking apparatus 1 preferably includes a cassette housing 2, a high force driving mechanism 4 and a housing bezel 6. Cassette housing 2 preferably includes a housing base 8, a housing cover 10 and a housing wall 12, wherein housing base 8 and housing wall 12 are non-movably associated with each other and disposed relative to each other so as to define a housing cavity 14 for movably containing a PCB 16.

In accordance with an exemplary embodiment, housing base 8 preferably includes a linkage cavity 33 and four mounting devices 38 for movably holding PCB 16. PCB 16 preferably includes a PCB mounting mechanism 40 and mounting device 38 preferably includes a device opening 39 for slidingly containing PCB mounting mechanism 40, wherein PCB mounting mechanism 40 may be a screw, a pin or any mounting mechanism suitable to the desired end purpose. In addition, housing base 8 preferably includes a linkage mounting receptacle shown generally at 9 configured in cavity 33 for associating driving mechanism 4 with housing base 8. In accordance with an exemplary embodiment, although linkage mounting receptacle 9 is preferably a receptacle opening for receiving a linkage mounting screw 91, linkage mounting receptacle 9 may be any receptacle device suitable to the desired end purpose, such as a clip receptacle. In accordance with an exemplary embodiment, it is considered within the scope of the invention that PCB 16 may be movably associated with housing base 8 using any device or method suitable to the desired end purpose, such as a screw or pin.

Housing wall 12 preferably includes a cable opening 18, a PCB connector opening 20 and a plurality of vent openings 22. In addition, housing wall 12 preferably includes a first protrusion 24 and a second protrusion 26 (FIG. 2), wherein first protrusion 24 and second protrusion 26 are disposed so as to lockingly engage with a main board 100 of a computer system. In accordance with an embodiment of the invention, first protrusion 24 and second protrusion 26 are shown as being disposed on housing wall 12. However, it is considered within the scope of the invention that first protrusion 24 and second protrusion 26 may be disposed anywhere on cassette housing 2 in a manner suitable to the desired end purpose. Moreover, housing wall 12 preferably includes at least one mounting structure 28 which defines a threaded cavity 30 for receiving a mounting apparatus 32 (FIG. 1), such as a screw. In addition, PCB connector opening 20 and cable opening 18 are preferably disposed so as to allow communication with the PCB connector 42 and the PCB cable connections 44 when PCB 16 is disposed within housing cavity 14.

Housing cover 10 preferably includes at least one cover opening disposed so as to allow communication with mounting structure 28 when housing cover 10 is associated with housing wall 12. Each cover opening 46 is preferably disposed so as to allow mounting apparatus 32 to communicate with threaded cavity 30 for non-movably associating housing cover 10 with housing wall 12. Although an exemplary embodiment describes housing cover 10 being non-movably associated with housing wall 12, it is considered within the scope of the invention that housing cover 10 may also be non-movably associated with housing base 8 and/or housing wall 12 using any mounting device or method suitable to the desired end purpose.

Figure 4:
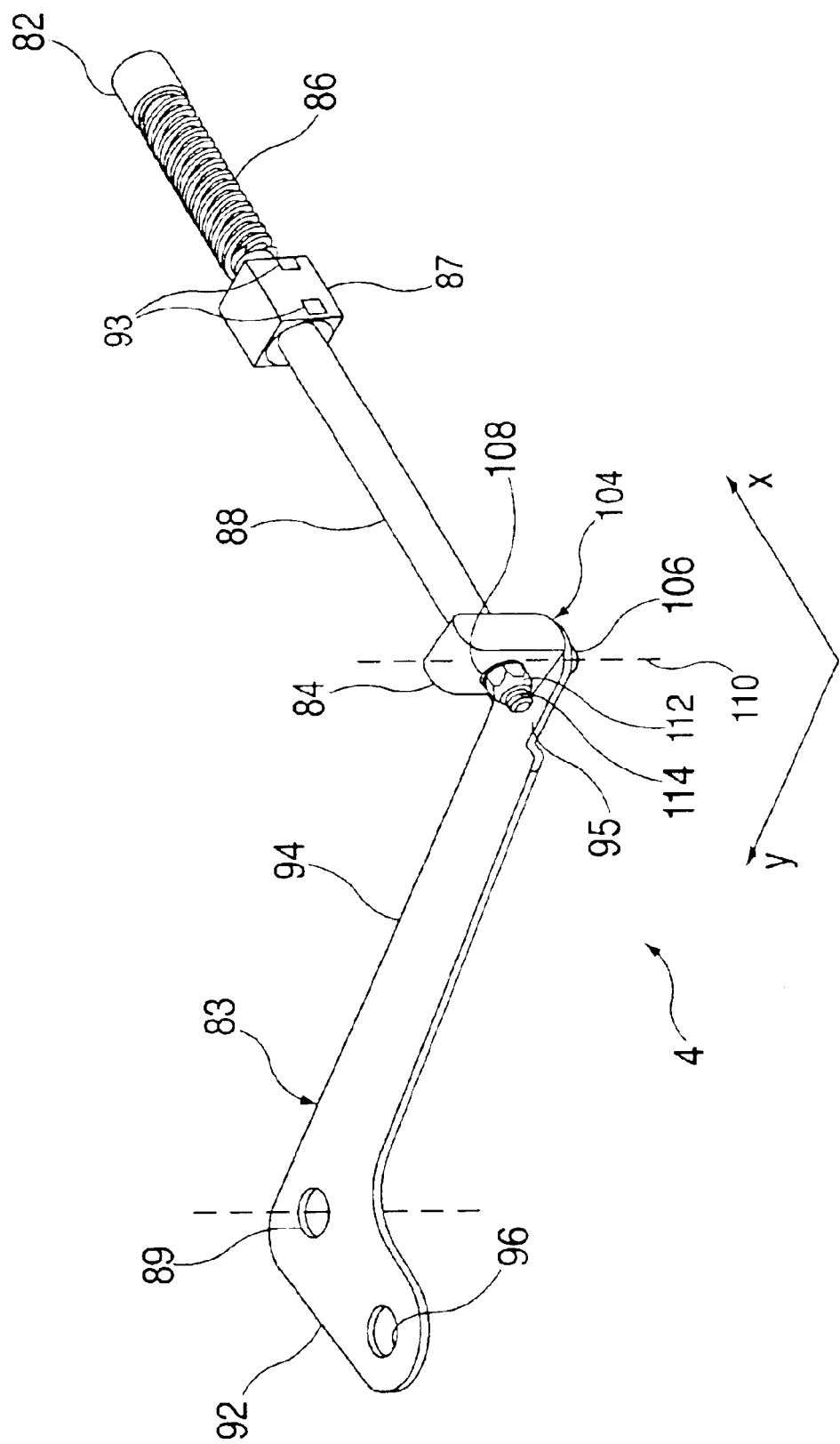
FIG. 4 is a perspective view of an exemplary embodiment of a high force multi-lead driving mechanism removed from the docking cassette of FIG. 3.

Referring to FIGS. 3 and 4, a linkage mechanism 4 is described and preferably includes a linkage arm 83 and a clevis 84 pivotally coupled to linkage arm 83 and configured to receive a first end of a shaft 88 therethrough while a second end of shaft 88 includes a thread 86 engaged with an operably fixed nut 87 secured to either housing 2 and/or housing bezel 6. In accordance with an exemplary embodiment, linkage arm 83 is preferably pivotally associated with clevis 84 and the first end of said shaft 88 is pivotally associated with an aperture configured in clevis 84. In accordance with an exemplary embodiment, linkage mechanism 4 is operably mounted within housing cavity 14 via a complimentary configured aperture 89 for receiving linkage mounting screw 91 allowing pivotal movement of linkage arm 83 about screw 91 or with any mounting device suitable to the desired end purpose, such as a clip. Further, linkage mechanism 4 is operably mounted within housing cavity 14 via nut 87 operably secured to housing bezel 6. Nut 87 is preferably mechanically connected to bezel 6, however, other suitable securing means are contemplated, including welding, for example. In addition, it is contemplated that nut 87 may also be secured to housing 2 instead of bezel 6 or in addition thereto. In an exemplary embodiment, nut 87 includes two clips 93 extending therefrom for operable connection through complimentary configured apertures 90 in bezel 6. Alternatively, nut 87 may be fastened to bezel and/or housing 2 using other fastening means, including welding, for example, or other mechanical fastening means.

Linkage arm 83 includes a first link arm 92 and a second link arm 94 substantially extending from aperture 89 and perpendicular to each other. First link arm 92 includes a first aperture 96 for operable connection with a corresponding aperture 98 aligned therewith and configured in PCB 16 for connecting PCB 16 to first link arm 92. In this manner, when linkage arm 83 pivots about screw 91, PCB connector 42 electrically engages and disengages with a respective connector 102 in board 100 (See FIG. 1). Second link arm 94 includes a second aperture shown generally at 104 proximate an end thereof for pivotally coupling with clevis 84. In an exemplary embodiment, second link arm 94 is about four times the length of first arm link 92, thus providing a 4:1 mechanical advantage with respect to engaging and disengaging PCB 16 with board 100 via manipulation of second link arm 94 proximate an end having clevis 84 coupled thereto. It will be noted that other lengths of arms 92, 94 are contemplated depending on the mechanical advantage desired. In an exemplary embodiment, second link arm 94 is further defined by an offset portion 95 substantially parallel to the remaining portion of second link arm 94. Raised portion 95 includes aperture 104 and is raised relative to the rest of linkage arm 83 to properly receive a bottom surface defining clevis 84 and properly align with shaft 88 extending through clevis 84.

Figure 5:
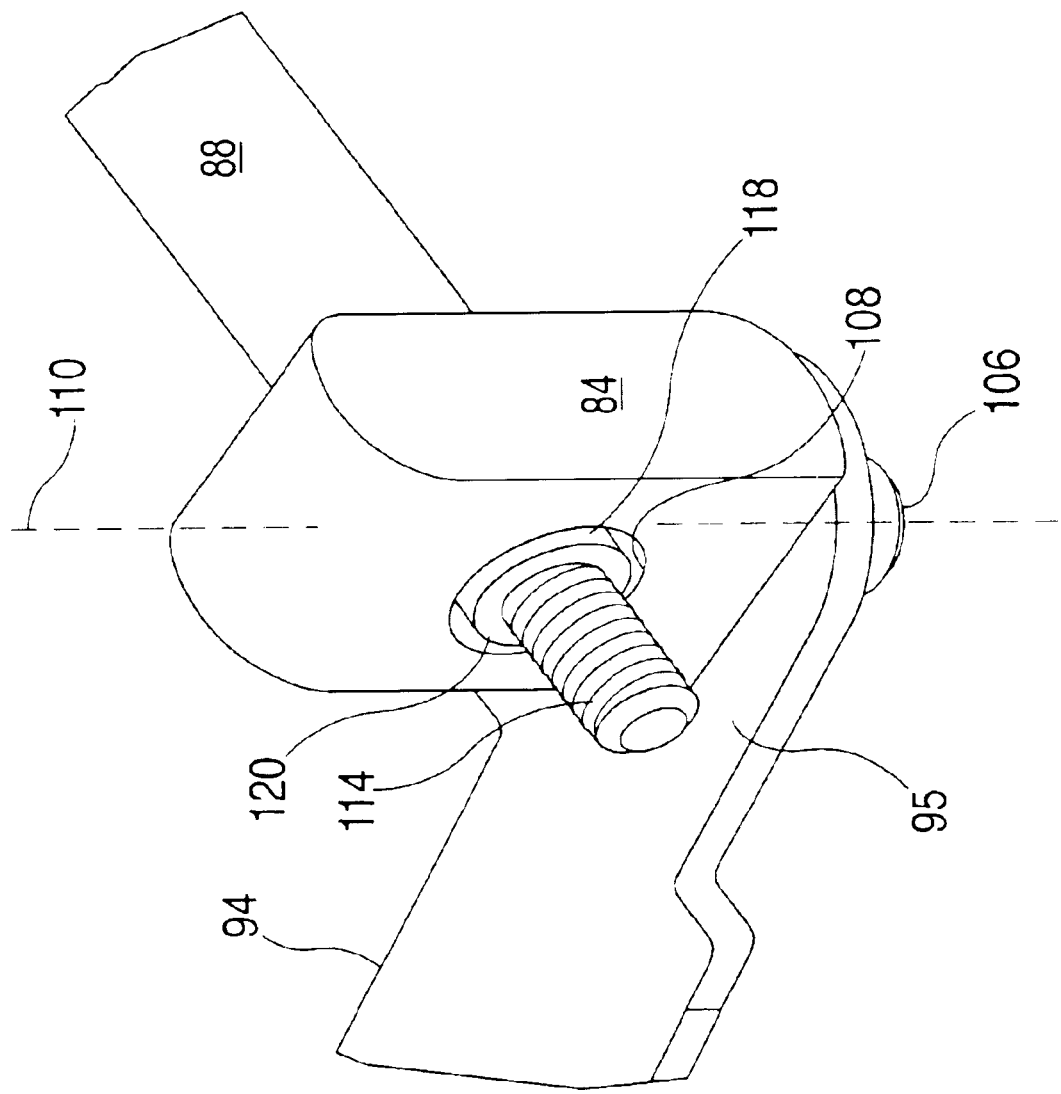
FIG. 5 is an enlarged partial perspective view of the high force multi-lead driving mechanism of FIG. 4 illustrating a clevis thereof in accordance with an embodiment of the invention.
Figure 6:
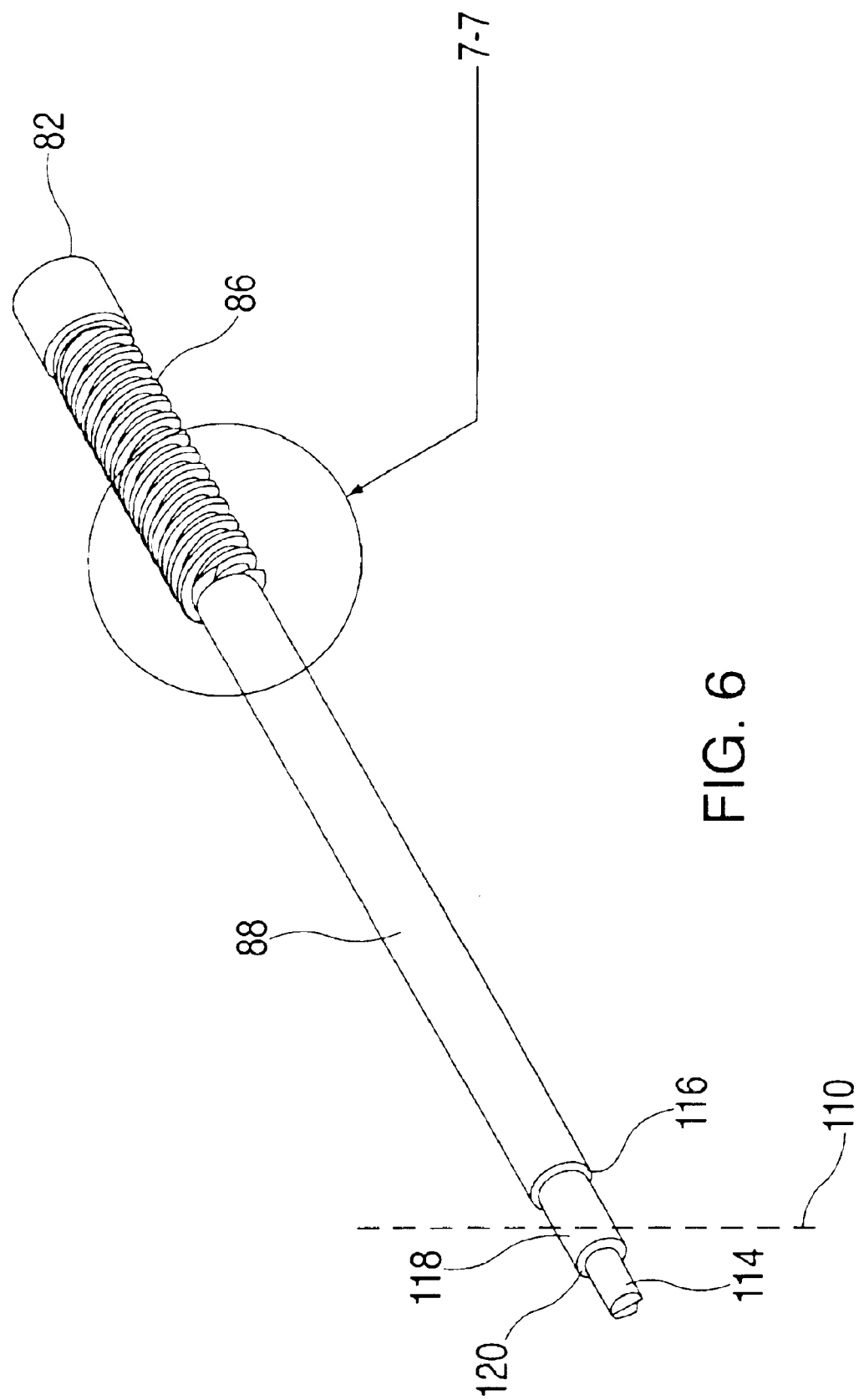
FIG. 6 is a perspective view of view of an exemplary embodiment of a multi-lead screw removed from the high force multi-lead driving mechanism of FIG. 4.

Referring now to FIGS. 4, 5, and 6, clevis 84 is configured having a pin 106 extending through second aperture 104 of linkage arm 83. Clevis 84 also includes an aperture 108 configured to allow shaft 88 extending therethrough pivotal rotation relative to clevis 84. In an exemplary embodiment, aperture 108 is elongate to allow shaft 88 pivotal rotation about an axis 110 defining an axis of pin 106. Shaft 88 is operably connected to clevis 84 with a nut 112 threadably engaged with a threaded portion 114 defining one end of shaft 88. Threaded portion 114 is stepped down in diameter relative to a diameter of the remaining shaft 88 which is sized larger than a diameter defining aperture 108. In this manner, thicker shaft portion 88 is restricted from axially translating through aperture 108 in one direction while nut 112 restricts translation of threaded portion. 114 through aperture 108 in the opposite direction. It will be recognized that clevis 84 is configured to allow three directions of movement simultaneously. More specifically, first clevis 84 allows rotary motion of shaft 88 extending therethrough when thread 86 is turned in and out of nut 87. Second, clevis 84 allows linear motion of shaft 88 along a center axis defining shaft 88. Third, since arm 94 pivots to create an arc, vertical travel or travel in the y-axis is required and provided by elongation of slot 118 in clevis 84 (See FIG. 4).

In an exemplary embodiment, shaft 88 is stepped where shoulder 116 is defined by an interface between a middle portion 118 and thicker shaft portion 88. An opposite end of middle portion 118 defines another shoulder 120 at an interface with threaded portion 114. Middle portion 118 is preferably smooth to aid pivotal movement thereof about axis 110 when disposed in elongated aperture 108 of clevis 84.

Figure 7:
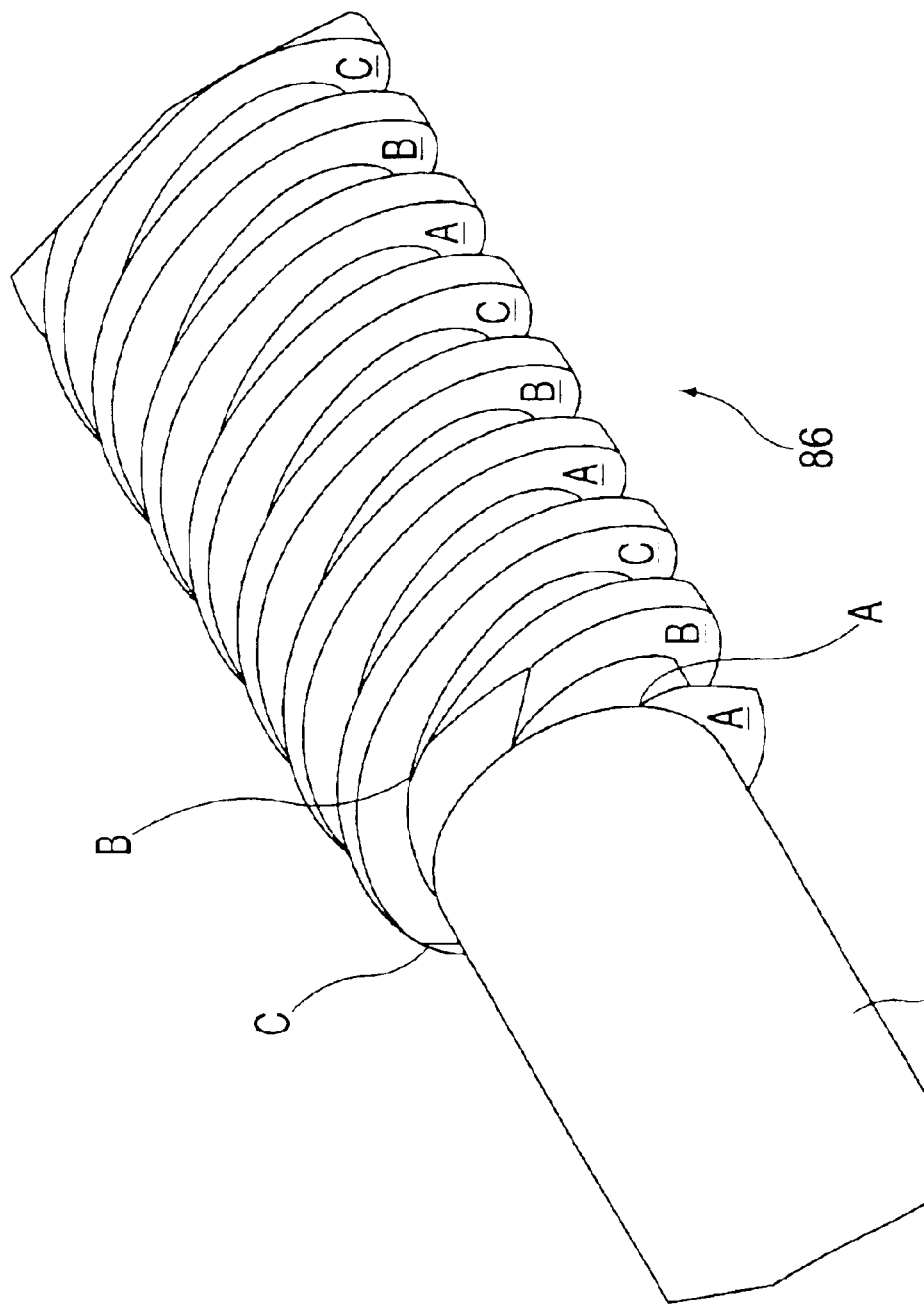
FIG. 7 is an enlarged partial perspective view of the high force multi-lead driving mechanism of FIG. 6 illustrating a multi-lead portion thereof in accordance with an embodiment of the invention.

Referring now to FIGS. 4, 6 and 7, an exemplary embodiment of the second end of shaft 88 includes a tri-lead thread 86 configured to threadably engage fixed nut 87. Tri-lead thread 86 provides the necessary force in a screw type drive which requires fewer revolutions to provide the force and travel necessary to reliably seat the mating connectors 42 and 102. A screw type drive requires a small effort force in turning the screw to overcome a large resistance force, thus yielding a very large mechanical advantage in minimum space. This is because the screw or thread 86 appear to be an inclined plane wound around cylindrical shaft 88. Tri-lead thread 86 includes three individual threads A, B, and C preferably contiguously wound with respect to one another that results in a 5/16" diameter screw with four threads per inch of a single respective thread instead of the typical 11 threads per inch in a 5/16" diameter screw. Although one of the threads A, B, C is sufficient to provide the needed mechanical advantage, the other two threads are included to distribute the load over three threads instead of just one. Furthermore, the other two threads do not consume any additional space, as they occupy space between the stretched out thread. By reducing the threads per inch the lead is increased by over three times without doing so, thus increasing the axial translation of shaft 88 in one revolution thereof via a handle 82 by three compared to the standard 11 thread per inch profile in a 5/16" diameter screw while being able to provide a force output in excess of 100 lbs. It will be noted that other diameters are contemplated and not limited to a 5/16" diameter, as larger diameters increase the relative mechanical advantage and vice versa.

Referring to the figures, a docking apparatus 1 containing a PCB 16 having a PCB mounting hole 17 is shown and discussed, wherein the docking apparatus 1 is disposed within a computer system. In accordance with an exemplary embodiment, linkage mechanism 4 is disposed within housing cavity 14 such that linkage arm 83 is communicated with linkage mounting receptacle 9 via aperture 89. Linkage mechanism 4 is then pivotally associated with housing base 8 via linkage arm 83 and linkage mounting receptacle 9 using linkage mounting screw 91. In accordance with an exemplary embodiment, a PCB 16 is then disposed within housing cavity 14 so as to allow communication with PCB connector 42 and PCB cable connections 44 through PCB connector opening 20 and cable opening 18, respectively. In addition, PCB 16 is disposed within housing cavity 14 so as to allow communication with mounting device 38 through PCB mounting hole 17. PCB 16 is preferably movably associated with housing base 8 using PCB mounting mechanism 40.

Figure 8:
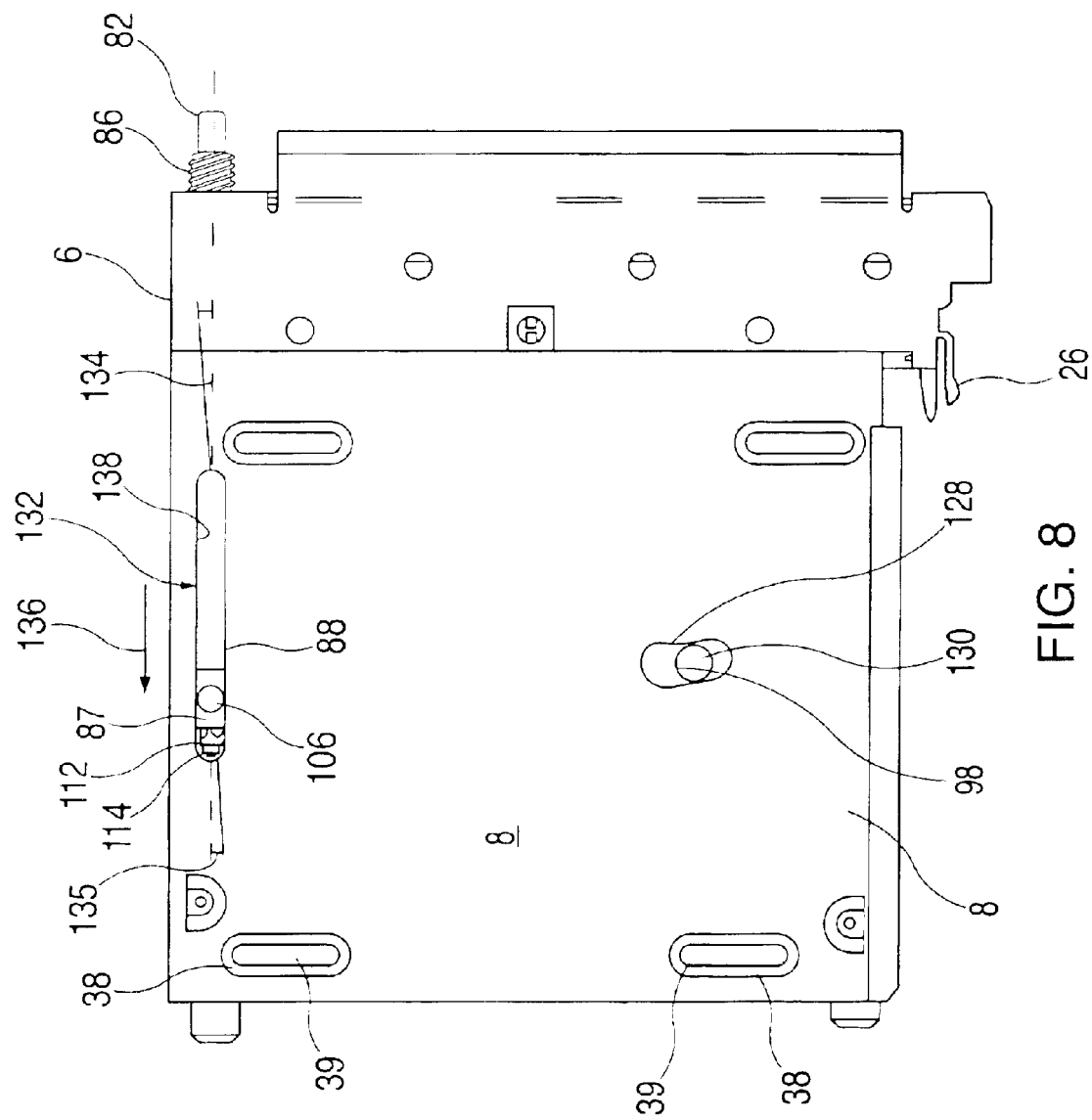
FIG. 8 is a backside view of the docking cassette shown in FIG. 3 illustrating an angular slot configured in a base thereof for guiding a pin extending from the clevis and providing over travel compensation.

Referring to FIG. 8, base 8 includes an arcuate slot 128 which receives a pin 130 extending through aperture 96 of link arm 83 for connection with PCB 16 (See also FIG. 2). Moreover, base 8 preferably includes an slot 132 disposed therein so as to be communicated with pin 106 extending from a bottom surface of clevis 87 for guiding the same. In an exemplary embodiment, slot is 132 is angular with respect to an axis 134 defining shaft 88 to provide an over travel mechanism. The angular slot as illustrated is about a 5 degree angle 135 with respect to axis 134, however other angles are contemplated depending on the amount of over travel desired. More specifically, the larger the angle the more over travel is limited, because as pin 106 translates therein, pin 106 experiences more resistance with larger angles of slot 130. In other words, as handle 82 is turned to engage PCB connector 42 with connector 102, pin 106 translates in a direction indicated with arrow 136. In this manner pin 106 begins to wedge against a top edge 138 defining slot 130. If the angle of slot 130 is increased, every turn of handle 82 experiences more resistance as edge 138 is sloped more to interfere with translation of pin 106 in direction 136. Handle 82 is preferably configured to accept manual rotation thereof and/or configured to accept a complimentary configured tool, such as a screwdriver, for rotation of the same.

Furthermore, although nut 87 is preferably secured to housing bezel 6 via slots 90 configured to accept clips 93 extending from nut 87, it is considered within the scope of the invention that nut 87 may be secured to at least one of housing 2 and/or bezel 6 using any device or method suitable to the desired end purpose. Linkage mechanism is preferably disposed within housing cavity 14 so as to be associated with linkage cavity 33 thus allowing linkage arm 83 to pivot without interference from housing base 8.

Linkage mechanism 4 is preferably disposed within housing cavity 14 so as to be movably associated with PCB 16 such that at least a portion of shaft 88 is protruding from cable opening 18. Linkage mechanism 4 is preferably disposed such that when handle 82 is turned in one direction, PCB 16 is translated via linkage arm 83 and pin 130 in arcuate slot 128 such that PCB connector 42 is moved toward PCB connector opening 20. Likewise, when handle 82 is turned in an opposite direction, PCB 16 is translates such that PCB connector 42 is moved away from PCB connector opening 20. Housing cover 10 is then disposed over housing cavity 14 so as to allow communication with threaded cavity 30 through cover opening 46.

Housing bezel 6 is preferably disposed over cable opening 18 so as to enclose housing cavity 14. In addition, housing bezel 6 is preferably disposed such that tail-stock mounting holes 140 are aligned with a corresponding cover opening 46 and threaded cavity 30. Housing cover 10, linkage mechanism 4 and housing bezel 6 are then non-movably associated with housing wall 12 using mounting apparatus 32.

Figure 9:
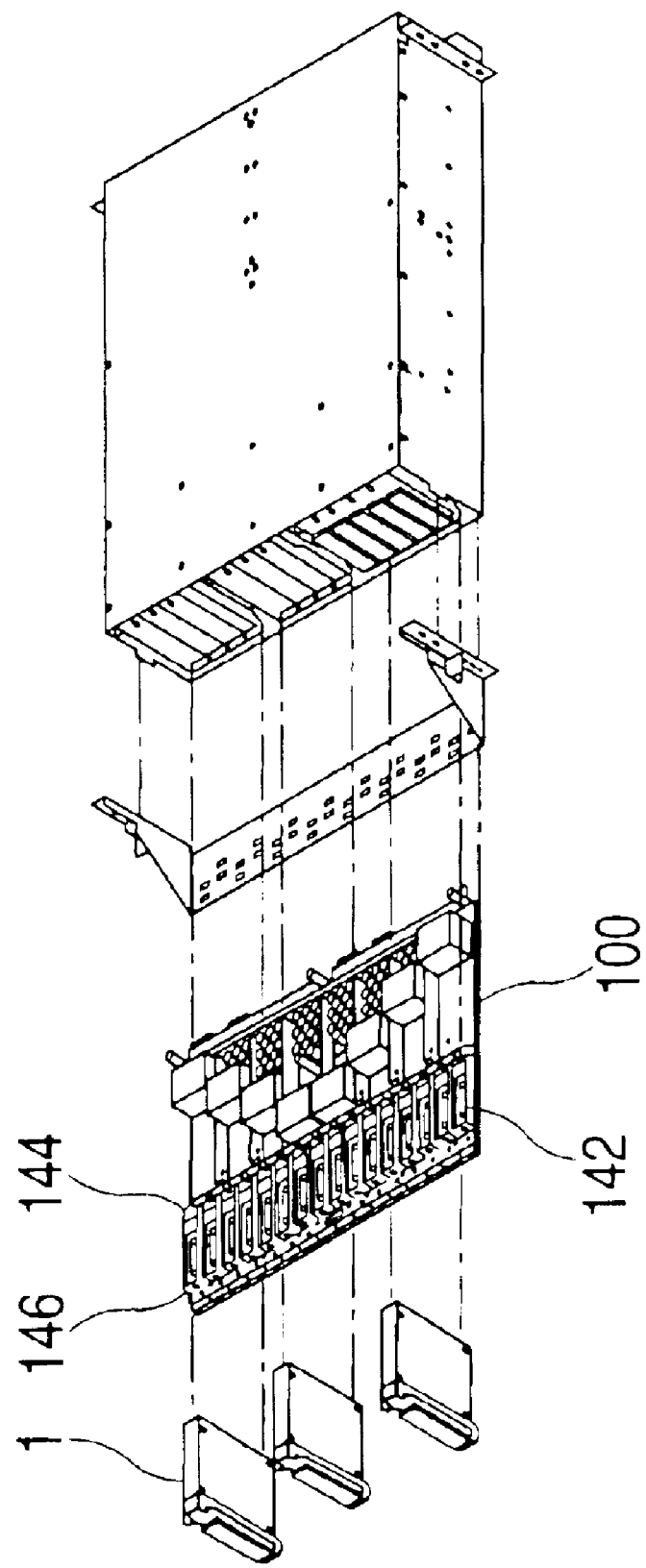
FIG. 9 is an exploded overall view of a docking cassette and a computer system in accordance with an embodiment of the invention.

In accordance with an exemplary embodiment and referring to FIG. 9, docking cassette 1 is then disposed onto a computer system main board 100 having a PCB connector receptacle 142, a first receptacle 144 and a second receptacle 146. Docking cassette 1 is preferably disposed onto computer system main board 100 such that PCB connector 42 is adjacent to PCB connector receptacle 142. In addition, docking cassette 1 is preferably disposed such that first protrusion 24 is communicated with first receptacle 144 and second protrusion 26 is communicated with second receptacle 106 so as to non-movably associate docking cassette 1 with computer system main board 100. Handle 82 of shaft 88 is then turned so as to cause linkage arm 83 to pivot about screw 91 via connection through clevis 84 to move PCB 16 toward opening 20. This causes first link arm 92 to compress PCB 16 via pin 130 in such a manner so as to electrically communicate PCB connector 42 and PCB connector receptacle 142. Likewise, turning handle 82 of shaft 88 in an opposite direction so as to cause shaft 88 to translate out of housing cavity 14 to pivot link arm 83 will cause first link arm to decompress PCB 16 via pin 130 in such a manner so as to electrically discommunicate PCB connector 42 and PCB connector receptacle 142.

In accordance with an embodiment of the invention, housing base 8 and housing wall 12 are preferably constructed from a rigid material such as plastic (polycarbonate with glass filler). However, it is considered within the scope of the invention that housing base 8 and housing wall 12 may be constructed from any material suitable to the desired end purpose.

In accordance with an embodiment of the invention, housing cover 10 is preferably constructed from a rigid material such as plastic. However, it is considered within the scope of the invention that housing cover 10 may be constructed from any material suitable to the desired end purpose.

In accordance with an embodiment of the invention, linkage mechanism 4 is preferably constructed from a rigid material having sufficient strength, such as steel and/or stainless steel. However, it is considered within the scope of the invention that linkage mechanism 4 may be constructed from any material suitable to the desired end purpose.

In accordance with an embodiment of the invention, housing bezel 6 is preferably constructed from a rigid material having sufficient strength, such as steel and/or stainless steel. However, it is considered within the scope of the invention that housing bezel 6 may be constructed from any material suitable to the desired end purpose.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A docking apparatus for printed circuit boards comprising:
    a cassette housing defining a housing cavity for containing a printed circuit board (PCB) and wherein said cassette housing further includes a PCB connector opening disposed so as to be communicated with said housing cavity; and
    a linkage mechanism disposed so as to be associated with said cassette housing, said linkage mechanism includes:
        a linkage arm pivotally connected to said cassette housing via a pivot, said linkage arm having a first arm pivotally connected to said PCB,
        a clevis pivotally connected to said linkage arm via a second arm extending from said first arm, said clevis having an aperture therethrough,
        a shaft extending through said aperture of said clevis at a first end defining said shaft, said first end configured to operably transfer axial translation of said shaft to said clevis, and an opposite second end defining said shaft includes a thread, and
        a nut operably secured to said cassette housing, said nut configured to threadably receive said thread for axial translation of said shaft therethrough,
        wherein rotation of said shaft translates said shaft causing pivotal movement of said linkage arm about said pivot via said clevis causing translation of said PCB in and out of engagement with a corresponding connector.

2. The docking apparatus according to claim 1, wherein said cassette housing includes a housing bezel disposed relative to said cassette housing defining a cable opening so as to be communicated with said housing cavity.

3. The docking apparatus according to claim 2, wherein cassette housing includes a housing base, a housing cover and a housing wall, wherein said housing base and said housing wall are disposed relative to each other so as to define said housing cavity for containing said printed circuit board (PCB).

4. The docking apparatus according to claim 2, wherein said nut is secured to at least one of said housing wall and said housing bezel and a portion of said shaft extends from cassette cavity for rotatable manipulation thereof.

5. The docking apparatus according to claim 1, wherein said thread includes a plurality of threads, each thread of said plurality of threads are disposed in a space defining a pitch of said each thread.

6. The docking apparatus according to claim 5, wherein said thread is a tri-lead thread configured to reduce the number of revolutions of said shaft to axial translate said shaft a selected distance.

7. The docking apparatus according to claim 6, wherein said each thread of said tri-lead thread is configured with four threads per inch offering increased mechanical advantage provided by the linkage arm alone and travel required thereof.

8. The docking apparatus according to claim 1, wherein said clevis is further defined with a pin extending therefrom, said pin is guidably received in a slot disposed in said cassette housing, said slot allows translation of said clevis generally in a same direction of said axial translation of said shaft.

9. The docking apparatus according to claim 8, wherein said slot is angularly disposed relative to said axial translation of said shaft providing over travel protection thereof.

10. The docking apparatus according to claim 8, wherein said aperture of said clevis is elongated to allow pivotal movement of said first end of said shaft extending therethrough about an axis defining said pin.

11. The docking apparatus according to claim 10, wherein said clevis allows for three directions of movement simultaneously.

12. The docking apparatus according to claim 1, wherein said second link arm is about four times longer than said first link arm providing addition mechanical advantage over that of said thread and said nut.

13. The docking apparatus according to claim 1, wherein said first end configured to operably transfer axial translation of said shaft to said clevis includes a stepped shaft having a second threaded portion defining an end thereof to threadably receive a second nut thereon.

14. The docking apparatus according to claim 13, wherein said stepped shaft includes three contiguous steps defining said first end, said three contiguous steps further defined by an intermediate step of the three contiguous steps, said intermediate step disposed in said aperture of said clevis.

15. The docking apparatus according to claim 14, wherein said second end of said shaft includes a handle configured to at least one of manually rotate said shaft and accept a tool for rotation thereof.

16. A docking apparatus according to claim 1, wherein said cassette housing includes a mounting device for movably containing a printed circuit board.

17. A docking apparatus according to claim 1, wherein said cassette housing includes a protrusion for non-movably communicating said cassette housing with a computer system.

18. A docking apparatus according to claim 1, wherein said housing bezel and said cassette housing are non-movably associated using one of a screw and a clip.

19. A docking apparatus according to claim 1, wherein said linkage mechanism is disposed relative to said cassette housing so as to be partially disposed within said housing cavity.

20. A docking apparatus comprising:

a printed circuit board;

a cassette housing having a mounting device and defining a housing cavity for movably containing said printed circuit board, said mounting device is disposed within said housing cavity so as to slidingly contain said printed circuit board within said housing cavity; and a linkage mechanism disposed within said housing cavity so as to be communicated with said printed circuit board, said linkage mechanism includes:

a linkage arm pivotally connected to said cassette housing via a pivot, said linkage arm having a first arm pivotally connected to said PCB, a clevis pivotally connected to said linkage arm via a second arm extending from said first arm, said clevis having an aperture therethrough, a shaft extending through said aperture of said clevis at a first end defining said shaft, said first end operably coupled with said clevis, and an opposite second end defining said shaft including a thread, and a nut operably secured to said cassette housing, said nut configured to threadably receive said thread for axial translation of said shaft therethrough, wherein rotation of said shaft axially translates said shaft in a first direction causing pivotal movement of said linkage arm about said pivot via said clevis causing translation of said PCB in a second direction generally perpendicular to said first direction in and out of engagement with a corresponding connector.

* * * * *